United States Patent
Sekine et al.

(10) Patent No.: US 9,460,965 B2
(45) Date of Patent: Oct. 4, 2016

(54) SEMICONDUCTOR SUBSTRATE, ELETRONIC DEVICE AND METHOD FOR MANUFACTURING THE SAME

(71) Applicant: NAPRA CO., LTD., Tokyo (JP)

(72) Inventors: Shigenobu Sekine, Tokyo (JP); Yurina Sekine, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 0 days.

(21) Appl. No.: 14/826,603

(22) Filed: Aug. 14, 2015

(65) Prior Publication Data

US 2015/0357273 A1 Dec. 10, 2015

Related U.S. Application Data

(62) Division of application No. 13/587,322, filed on Aug. 16, 2012, now Pat. No. 9,230,860.

(30) Foreign Application Priority Data

Sep. 27, 2011 (JP) .................................. 2011-210916
Feb. 13, 2012 (JP) .................................. 2012-028669

(51) Int. Cl.
*H01L 23/48* (2006.01)
*H01L 21/768* (2006.01)
(Continued)

(52) U.S. Cl.
CPC ....... *H01L 21/76898* (2013.01); *H01L 23/481* (2013.01); *H01L 23/49827* (2013.01); *H01L 23/49838* (2013.01); *H01L 21/02109* (2013.01); *H01L 21/02225* (2013.01); *H01L 21/02227* (2013.01); *H01L 21/02269* (2013.01); *H01L 21/28* (2013.01); *H01L 21/768* (2013.01);
(Continued)

(58) Field of Classification Search
CPC ..................................................... H01L 21/288
See application file for complete search history.

(56) References Cited

U.S. PATENT DOCUMENTS

2004/0016962 A1 1/2004 Okumura et al.
2004/0228967 A1* 11/2004 Leung ............... H01L 21/76837
427/180
(Continued)

FOREIGN PATENT DOCUMENTS

JP 4-56134 A 2/1992
JP 10-270605 A 10/1998
(Continued)

OTHER PUBLICATIONS

Japanese Office Action dated Aug. 8, 2012, issued in corresponding Japanese Patent Application No. 2012-028669, w/ English translation.
(Continued)

*Primary Examiner* — William Harriston
(74) *Attorney, Agent, or Firm* — Westerman, Hattori, Daniels & Adrian, LLP

(57) ABSTRACT

A semiconductor substrate includes a vertical conductor and an insulating layer. The vertical conductor includes a metal/alloy component of a nanocomposite crystal structure and is filled in a vertical hole formed in the semiconductor substrate along its thickness direction. The insulating layer is formed around the vertical conductor in a ring shape and includes nm-sized silica particles and a nanocrystal or nanoamorphous silica filling up a space between the silica particles to provide a nanocomposite structure along with the silica particles.

8 Claims, 14 Drawing Sheets

(51) Int. Cl.
*H01L 23/498* (2006.01)
*H01L 21/02* (2006.01)
*H01L 21/28* (2006.01)

(52) U.S. Cl.
CPC ...... *H01L21/76838* (2013.01); *H01L 2224/16* (2013.01); *H01L 2924/1305* (2013.01); *H01L 2924/13091* (2013.01); *H01L 2924/1461* (2013.01)

(56) References Cited

U.S. PATENT DOCUMENTS

| | | |
|---|---|---|
| 2006/0118965 A1 | 6/2006 | Matsui |
| 2008/0237781 A1 | 10/2008 | Uchiyama |
| 2010/0301485 A1 | 12/2010 | Sekine et al. |
| 2011/0284912 A1* | 11/2011 | Sekine .................. H01L 23/481 257/99 |

FOREIGN PATENT DOCUMENTS

| | | |
|---|---|---|
| JP | 2004-31923 A | 1/2004 |
| JP | 2005-216907 A | 8/2005 |
| JP | 2006-216793 A | 8/2006 |
| JP | 2008-251964 A | 10/2008 |
| JP | 2010-153655 A | 7/2010 |
| JP | 2010-177647 A | 8/2010 |
| JP | 2011-129663 A | 6/2011 |

OTHER PUBLICATIONS

Japanese Office Action dated Nov. 28, 2012, issued in corresponding Japanese Patent Application No. 2012-028669.

* cited by examiner

SEMICONDUCTOR SUBSTRATE, ELETRONIC DEVICE AND METHOD FOR MANUFACTURING THE SAME

CROSS-REFERENCE TO RELATED APPLICATION

The application is a Divisional of U.S. patent application Ser. No. 13/587,322, filed on Aug. 16, 2012, which claims priority to Japanese priority application No. 2011-210916 filed on Sep. 27, 2011 and No. 2012-028669 filed on Dec. 13, 2012, the entire contents of which are hereby incorporated by reference.

BACKGROUND OF THE INVENTION

1. Field of the Invention

The present invention relates to a semiconductor substrate, an electronic device and a method for manufacturing the same.

2. Description of the Related Art

Recently, there has been proposed a TSV (through-silicon-via) technology of providing a circuit substrate with a large number of through-electrodes and stacking such circuit substrates. With the TSV technology, many functions can be packed into a small footprint and important electrical pathways between elements can also be dramatically shortened to increase processing speed.

When using the TSV technology, the through-electrodes must be electrically insulated from a silicon substrate. As means for electrical insulation, Japanese Unexamined Patent Application Publication No. 2008-251964 discloses a technology of forming a ring-shaped isolation groove passing through a silicon substrate in such a manner as to surround a through-electrode passing through the silicon substrate, forming a silicon film directly on the bottom surface and the side surfaces of the isolation groove, then forming an insulation film on the silicon film in such a manner as to fill up a gap left in the isolation groove, and thermally oxidizing each surface of the silicon film in contact with the inner or outer peripheral side surface of the isolation groove into a thermally-oxidized silicon film.

However, since it requires the steps of forming a silicon film directly on the bottom surface and the side surfaces of the isolation groove, forming an insulation film on the silicon film in such a manner as to fill up a gap left in the isolation groove after formation of the silicon film, and then thermally oxidizing the surface of the silicon film, the process inevitably becomes complicated and time-consuming. When replacing the conventional planar arrangement with the TSV technology, cost performance is important from the viewpoint of industrial mass production, but the above related art cannot meet this need sufficiently.

Moreover, since it is configured to electrically insulate the through-electrodes and the silicon substrate with the thermally-oxidized silicon film, it is difficult to form a sufficiently thick insulating film and therefore it is difficult to decrease capacitance for the through-electrodes, which results in limiting improvement in signal transmission properties and reduction of power consumption.

Furthermore, since it is difficult to form a sufficiently thick insulating film, the effect of relaxing a stress occurring in the vicinity of the through-electrodes with the insulation film can be hardly expected. Therefore, the semiconductor circuit elements have to be located away from the through-electrodes, reducing area efficiency.

On the other hand, Japanese Unexamined Patent Application Publication No. 2004-31923 discloses technical details of forming a separating trench groove for a MOS capacitor or a bipolar capacitor. The disclosed information is roughly as follows.

(a) A suspension having insulating particles such as silica particles dispersed in a disperse medium such as an organic solvent is applied to a trench-having surface of a silicon substrate by spin coating, and then, the disperse medium is removed from the applied film to fill the trench with the insulating particles. The insulating particles are bonded neither to each other nor to the side walls and bottom surface of the trench. Then, the top of the trench is closed by a reflowable dielectric layer, preventing the insulating particles from escaping from the trench.

(b) Also disclosed is a particulate insulating layer in which after the insulating particles are filled in the trench in the same manner as in the above (a), the insulating particles are bonded to each other through an insulating binder to form a network structure of the insulating particles and the insulating binder. It describes that an inorganic or organic SOG obtained by dissolving a silanol in an organic solvent can be used as a material for the insulating binder. Also disclosed is that —OH and —O— bonded to an Si atom in the silanol used for the inorganic or organic SOG can be partially replaced with —H, that —CH3 in the silanol used for the organic SOG can be replaced with other alkyl groups such as —C2H5, that —OH and —O— bonded to an Si atom in the silanol used for the organic SOG can be partially replaced with alkyl groups such as —CH3 and —C2H5, and so on.

(c) A first particulate insulating layer containing no binder and a second particulate insulating layer containing a binder are combined to provide an insulating layer. The top of the first particulate insulating layer containing no binder is covered with the second particulate insulating layer containing an insulating binder.

(d) A particulate insulating layer forming an insulating layer includes first and second insulating particles that are homogeneously mixed together and an insulating binder for cross-linking them.

In Japanese Unexamined Patent Application Publication No. 2004-31923, however, since the insulating particles such as silica particles are bonded neither to each other nor to the side walls and bottom surface of the trench, it is required to employ the technique of closing the top of the trench with a reflowable dielectric layer (see the above (a)) or the technique of bonding the insulating particles through a binder (see the above (b) to (d)), complicating the insulating structure and the manufacturing process.

In the case of the above technique (a), moreover, it is impossible to form an insulating layer having a high adhesion strength to the silicon substrate. In the case of the technique (b), since the particulate insulating layer has a network structure formed from the insulating particles and the insulating binder, the adhesion strength of the insulating layer to the silicon substrate is not sufficient, either. When using a binder such as an organic SOG, on the other hand, since the insulating layer contains carbon, it is not inherently desirable as an insulating layer that requires high insulation resistance. In the techniques (c) and (d), since the first and second insulating particles are included, the problem still remains regarding the adhesion strength.

When insulating a vertical conductor forming the through-electrode or the like, furthermore, the vertical conductor may be embedded in the insulating layer itself, but such an insulating structure cannot be dealt with by the technology described in Japanese Unexamined Patent Application Publication No. 2004-31923.

SUMMARY OF THE INVENTION

It is an object of the present invention to provide a highly reliable semiconductor substrate having an insulating layer with a high adhesion strength to the semiconductor substrate, an electronic device and a method for manufacturing the same.

It is another object of the present invention to provide a highly reliable semiconductor substrate capable of preventing defects such as a crack in a silicon substrate, a semiconductor circuit element or an insulating layer, an electronic device and a method for manufacturing the same.

It is still another object of the present invention to provide a semiconductor substrate having a low-cost insulating structure, an electronic device and a method for manufacturing the same.

It is yet another object of the present invention to provide a semiconductor substrate having an insulating structure that has a low capacitance between a vertical conductor and the substrate because of a sufficiently thick insulating film and is therefore capable of contributing to improvement in signal transmission properties and reduction of power consumption, an electronic device and a method for manufacturing the same.

It is yet another object of the present invention to provide a semiconductor substrate capable of relaxing a stress occurring in the vicinity of a through-electrode to improve area efficiency for formation of semiconductor circuit elements, an electronic device and a method for manufacturing the same.

In order to attain at least one of the above objects, a semiconductor substrate according to the present invention comprises a vertical conductor and an insulating layer. The vertical conductor includes a metal/alloy component of a nanocomposite crystal structure and is filled in a vertical hole formed in the semiconductor substrate along its thickness direction. The insulating layer is formed around the vertical conductor in a ring shape and includes nm-sized silica particles and a nanocrystal or nanoamorphous silica filling up a space between the silica particles to provide a nanocomposite structure along with the silica particles.

In the present invention, the terms "nm-sized" and "nano" refer to a range equal to or less than 1 µm. On the other hand, the nanocomposite structure of the insulating layer refers to a structure in which at least two kinds of components are combined to form a complex and these components are in the form of nm-sized particles or in the nanocrystalline or nanoamorphous phase.

In the semiconductor substrate according to the present invention, as described above, the vertical conductor includes a metal/alloy component of a nanocomposite crystal structure and is filled in a vertical hole formed in the semiconductor substrate along its thickness direction. Since the vertical hole is enclosed by a wall, a stress occurring in the vertical conductor filled therein can be applied to the inner wall surface of the vertical hole as it is, which may cause fracturing or cracking of the inner wall surface. In the present invention, since the vertical conductor includes a metal/alloy component of a nanocomposite crystal structure, the stress can be reduced. In addition, since the nanocomposite crystal structure serves to facilitate formation of equiaxed crystal in the vertical conductor, the stress reducing effect becomes more effective. Therefore, the stress to be applied from the vertical conductor to the inner wall surface of the vertical hole can be relaxed to avoid fracturing or cracking of the inner wall surface.

In the present invention, moreover, since the insulating layer is formed around the vertical conductor in a ring shape, a current passing through the vertical conductor can be prevented from leaking to the semiconductor substrate by the insulating layer.

Since the insulating layer includes nm-sized silica particles and a nanocrystal or nanoamorphous silica tightly filling up a space between the silica particles to provide a nanocomposite structure along with the silica particles, the resulting insulating layer is free from any defects such as crack or hollow and highly reliable.

In the present invention, the insulating layer can be obtained with a liquid silica or liquid Si compound infiltrated into the space between the silica particles to have a nanocomposite structure including a nanocrystal region and a nanoamorphous region. This reduces the stress as a specific effect of the nanocomposite structure, so that the distance between semiconductor circuit elements and the insulating layer can be shortened to improve area efficiency for formation of the semiconductor circuit elements.

Since the insulating layer is formed around the vertical conductor in a ring shape, the stress occurring in the vertical conductor can be applied to the insulating layer, wherein if the stress is too large, the insulating layer may be fractured or cracked. If the insulating layer is fractured or cracked, the insulating layer cannot play a primary role, causing leakage of current from the vertical conductor to the semiconductor substrate. In the present invention, regarding this problem, since the vertical conductor includes a metal/alloy component of a nanocomposite crystal structure, the stress can be reduced as described above. In addition, since the nanocomposite crystal structure serves to facilitate formation of equiaxed crystal in the vertical conductor, the stress reducing effect becomes more effective. Therefore, the stress to be applied from the vertical conductor to the inner wall surface of the vertical hole and to the insulating layer can be relaxed to avoid fracturing or cracking of the inner wall surface and the insulating layer.

When applied to the TSV technology, the insulating layer according to the present invention can be used to electrically insulate the vertical conductor extending in a silicon substrate along its thickness direction from other vertical conductors and semiconductor circuit elements formed in the silicon substrate.

The insulating layer can be formed by filling an insulating material into a ring-shaped groove or a hole that is formed in the silicon substrate along its thickness direction. The insulating layer thus formed does not cost much and has a sufficient thickness commensurate with the width of the ring-shaped groove or the diameter of the hole. Therefore, the capacitance between the vertical conductor and the silicon substrate can be reduced to provide an insulating structure capable of contributing to improvement in signal transmission properties and reduction of power consumption.

Furthermore, since the insulating layer has a sufficient thickness commensurate with the width of the ring-shaped groove or the diameter of the hole, the stress occurring in the vicinity of a through-electrode can be relaxed to improve area efficiency for formation of semiconductor circuit elements.

According to a specific embodiment, the insulating layer may be filled in a ring-shaped groove that is formed in the silicon substrate to surround the vertical conductor, i.e., may take the form of a ring-shaped insulating layer.

The ring-shaped insulating layer may have an insulating layer on the inner wall surface of the ring-shaped groove. This insulating layer preferably includes an oxide layer, more preferably a nitride layer. The oxide layer and the nitride layer may be a single layer or multiple layers. In addition, the oxide layer and the nitride layer may be a layer deposited on inner surfaces of the ring-shaped groove or a layer obtained by oxidizing or nitriding the surface of the silicon substrate which appears on the inner surfaces of the ring-shaped groove.

According to another embodiment, the insulating layer may be filled in a hole that is formed in the silicon substrate along its thickness direction, and the vertical conductor may be filled in a hole that is formed in the insulating layer. This hole may also have an oxide layer or a nitride layer on its inner wall surface in the same manner as the ring-shaped groove.

Specifically, the semiconductor substrate according to the present invention may take the form of an interposer. Alternatively, it may take the form of a semiconductor wafer or a semiconductor device having semiconductor elements inside the silicon substrate.

It is also possible that a plurality of the substrates according to the present invention are stacked to form an electronic device.

The present invention also discloses a method for manufacturing the foregoing semiconductor substrate. This manufacturing method comprises an insulating layer forming process and a vertical conductor forming process. The insulating layer forming process includes the steps of; forming a hole or groove in the semiconductor substrate along its thickness direction; pouring a suspension having silica particles dispersed in a volatile organic solvent into the hole or groove; pouring a liquid silica or liquid Si compound into the hole or groove for infiltration into a space between the silica particles; and performing a heat treatment to promote conversion of the infiltrated liquid silica or liquid Si compound to silica. The heat treatment includes the steps of heating the contents of the hole or groove under a pressure and then cooling them under a pressure.

The vertical conductor forming process includes the steps of; forming a vertical hole within an area surrounded by the insulating layer to extend along the thickness direction of the semiconductor substrate; and forming a conductor including a metal/alloy component of a nanocomposite crystal structure within the vertical hole.

According to the above manufacturing method, the semiconductor substrate and the electronic device according to the present invention can be mass-produced at a low cost.

In the manufacturing method according to the present invention, the liquid silica may be a silica sol or the like. The liquid Si compound may be a compound having an Si—N bond. Concrete examples of such Si compounds include an inorganic polymer having the Si—N bond as a basic unit, typically, a perhydropolysilazane (PHPS). Also available are a siloxane corresponding to a general formula R3SiO—(R2SiO)n-SiR3 and a silanol corresponding to a general formula (R3Si—OH). An organic solvent solution can be prepared from such an Si compound and poured into the hole or groove.

When using the liquid Si compound, a hydroxyl group of the volatile organic solvent remaining on a surface of the silica particles can be used for the conversion of the Si compound to silica.

Pouring of the suspension into the hole or groove can be performed under a reduced pressure within a vacuum chamber. While most of the volatile organic solvent in the suspension evaporates during this process, the hydroxyl group of the volatile organic solvent remains on the surface of the silica particles. This remaining hydroxyl group can be used for the conversion of the Si compound to silica.

Also preferably, pouring of the liquid silica or liquid Si compound into the hole or groove is performed under a reduced pressure within a vacuum chamber. This is because the liquid silica or liquid Si compound can be reliably infiltrated into the space between the silica particles under a reduced pressure.

Preferably, the liquid silica or liquid Si compound poured into the hole or groove is subjected to a heat treatment. With this, the conversion to silica can be promoted, while the organic substances can be pyrolyzed and released as a gas.

Furthermore, the heat treatment preferably includes the steps of heating the contents of the hole or groove under a pressure and then cooling them under a pressure. With this process, the pyrolysis of the organic substances can be further promoted, while the insulating layer can be compacted to increase the adhesion strength to the semiconductor substrate.

As has been described above, the following effects can be obtained according to the present invention.

(a) It is possible to provide a highly reliable semiconductor substrate having an insulating layer with a high adhesion strength to the semiconductor substrate, an electronic device and a method for manufacturing the same.

(b) It is possible to provide a highly reliable semiconductor substrate free from defects such as a crack, an electronic device and a method for manufacturing the same.

(c) It is possible to provide a semiconductor substrate having an insulating structure that has a sufficiently thick insulating film and is capable of contributing to improvement in signal transmission properties and reduction of power consumption, an electronic device and a method for manufacturing the same.

(d) It is possible to provide a semiconductor substrate capable of relaxing a stress occurring in the insulating layer to improve area efficiency for formation of semiconductor circuit elements, an electronic device and a method for manufacturing the same.

(e) It is possible to provide a semiconductor substrate having a low-cost insulating structure, an electronic device and a method for manufacturing the same.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
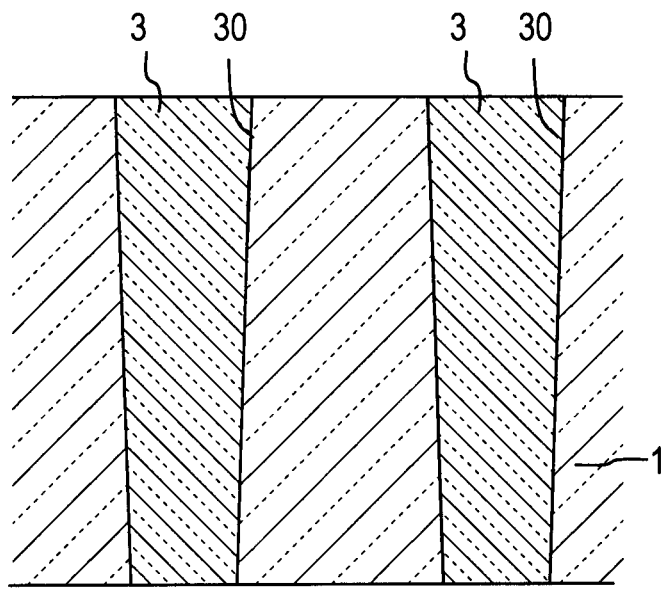
FIG. 1 is a sectional view showing a part of a semiconductor substrate according to the present invention.
Figure 2:
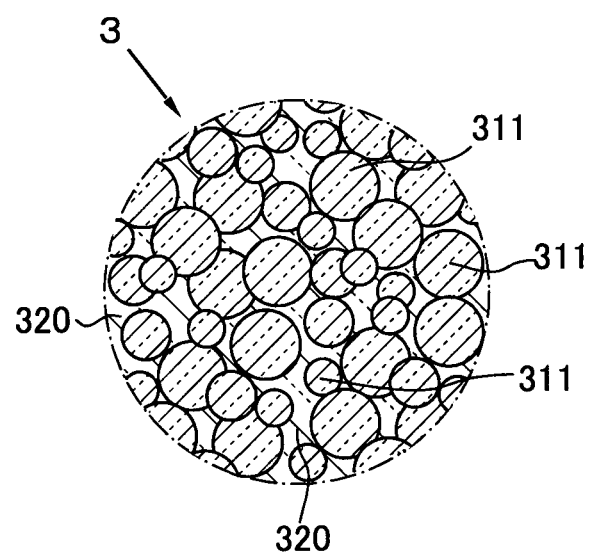
FIG. 2 is an enlarged view schematically showing the structure of an insulating layer in the semiconductor substrate shown in FIG. 1.

Referring to FIGS. 1 and 2, a semiconductor substrate 1 according to the present invention has insulating layers 3 extending along its thickness direction. Although the semiconductor substrate has both insulating layers and vertical conductors, only the insulating layers 3 are shown in FIGS. 1 and 2. The insulating layer 3 is filled in a hole or groove (hereinafter referred to as "via") 30 that is formed in, for example, a silicon substrate forming the semiconductor substrate 1 along its thickness direction. The groove may take any shape such as a straight line shape, a curved line shape or a ring shape. In the case of the hole, its opening may take any shape such as a circular shape, a square shape or an oval shape.

The insulating layer 3 includes nm-sized silica particles 311 and a nanocrystal or nanoamorphous silica 320 filling up a space between the silica particles 311, 311 to provide a nanocomposite structure along with the silica particles 311. The definitions of "nm-sized" and "nanocomposite structure" are the same as described above. Specifically, the insulating layer 3 is obtained with a liquid silica or liquid Si compound filled into the space between the silica particles 311, 311 to have a nanocomposite structure including a nanocrystal region and a nanoamorphous region.

While the silica particles 311 exist in the form of particles, the silica 320 is amorphous in the sense that it fills up the space between the silica particles 311. Accordingly, even though their elements are almost identical $SiO_2$, since their microscopic forms are different from each other, the silica particles 311 and the silica 320 can be distinguished from each other.

The silica particles 311 have a nm-sized particle size (equal to or less than 1 μm). In principle, the particle size is preferably equal to or less than one-tenth of a groove width of the via 30. When the hole diameter or groove width of the via 30 is equal to or less than 10 μm, for example, set to a few μm, the particle size of the silica particle 311 is equal to or less than 1 μm, for example, about a few hundred nm. Although the silica particles 311 are illustrated as a spherical body in FIG. 2, their external shape is arbitrary and not limited to the spherical shape. In addition, the silica particles 311 are not required to have a uniform particle size but may have different particle sizes within the above-described nm-sized range. The silica 320 filling up the surrounding area of the silica particles 311 does not contain Na which could cause corrosion.

In the semiconductor substrate 1 according to the present invention, as described above, since the insulating layer 3 includes the nm-sized silica particles 311 and the nanocrystal or nanoamorphous silica 320 filling up the space between the silica particles 311, 311 to provide a nanocomposite structure along with the silica particles 311, the resulting insulating layer 3 is free from any defects such as crack or hollow and highly reliable.

More specifically, if the insulating layer 3 is formed only from the silica particles 311, small voids or hollows may be formed between the silica particles 311, 311 to cause cracking of the insulating layer 3, and such cracks may extend to the semiconductor substrate 1, e.g., the silicon substrate, damaging the silicon substrate and semiconductor circuit elements formed therein.

In the case of containing only the silica 320 instead of the silica particles 311, when the size is equal to or greater than 200 nm, for example, cracking occurs to decrease the reliability of insulation.

In the present invention, on the other hand, the insulating layer 3 includes the silica particles 311 and the nanocrystal or nanoamorphous silica 320 filling up the surrounding area of the silica particles 311, so that small voids or hollows between the silica particles 311, 311 are filled up with the silica 320. This prevents cracking of the insulating layer 3, avoiding the problem that the silicon substrate and semiconductor circuit elements formed therein may be damaged by cracking or the like.

When the nanocomposite structure is formed from the nm-sized silica particles 311 and the nanocrystal or nanoamorphous silica 320 tightly filling up the surrounding area of the silica particles 311, moreover, stress can be reduced as a specific effect of the nanocomposite structure, so that the distance between semiconductor circuit elements and the insulating layer 3 can be shortened to improve area efficiency for formation of the semiconductor circuit elements.

Furthermore, there are the following differences as compared with Japanese Unexamined Patent Application Publication No. 2004-31923.

(a) Since the insulating layer 3 according to the present invention can adhere to the semiconductor substrate 1, it is not necessary to close the top of the trench with a reflowable dielectric layer, unlike the technology disclosed in Japanese Unexamined Patent Application Publication No. 2004-31923.

(b) In the insulating layer 3 according to the present invention, the nanocrystal or nanoamorphous silica 320 tightly fills up the surrounding area of the nm-sized silica particles

311, unlike the technology of Japanese Unexamined Patent Application Publication No. 2004-31923, in which an insulating layer having a network structure is formed from an inorganic or organic SOG. With this structural difference, the insulating layer 3 according to the present invention has an excellent electrical insulation and a high adhesion strength to the semiconductor substrate, as compared with the technology disclosed in Japanese Unexamined Patent Application Publication No. 2004-31923. There is also a difference in that the network structure is used to relax the stress in Japanese Unexamined Patent Application Publication No. 2004-31923, while the nanocomposite structure is used to relax the stress in the present invention.

(c) The insulating layer 3 according to the present invention does not contain carbon, unlike Japanese Unexamined Patent Application Publication No. 2004-31923. With this structural difference, the insulating layer 3 according to the present invention becomes an insulating layer having a high insulation resistance.

(d) The insulating layer 3 according to the present invention includes only the silica particles 311 as particles and therefore is different from the technology of Japanese Unexamined Patent Application Publication No. 2004-31923, in which it contains the first and second insulating particles. With this structural difference, the insulating layer 3 according to the present invention has a higher adhesion strength than the insulating layer of Japanese Unexamined Patent Application Publication No. 2004-31923.

Figure 3:
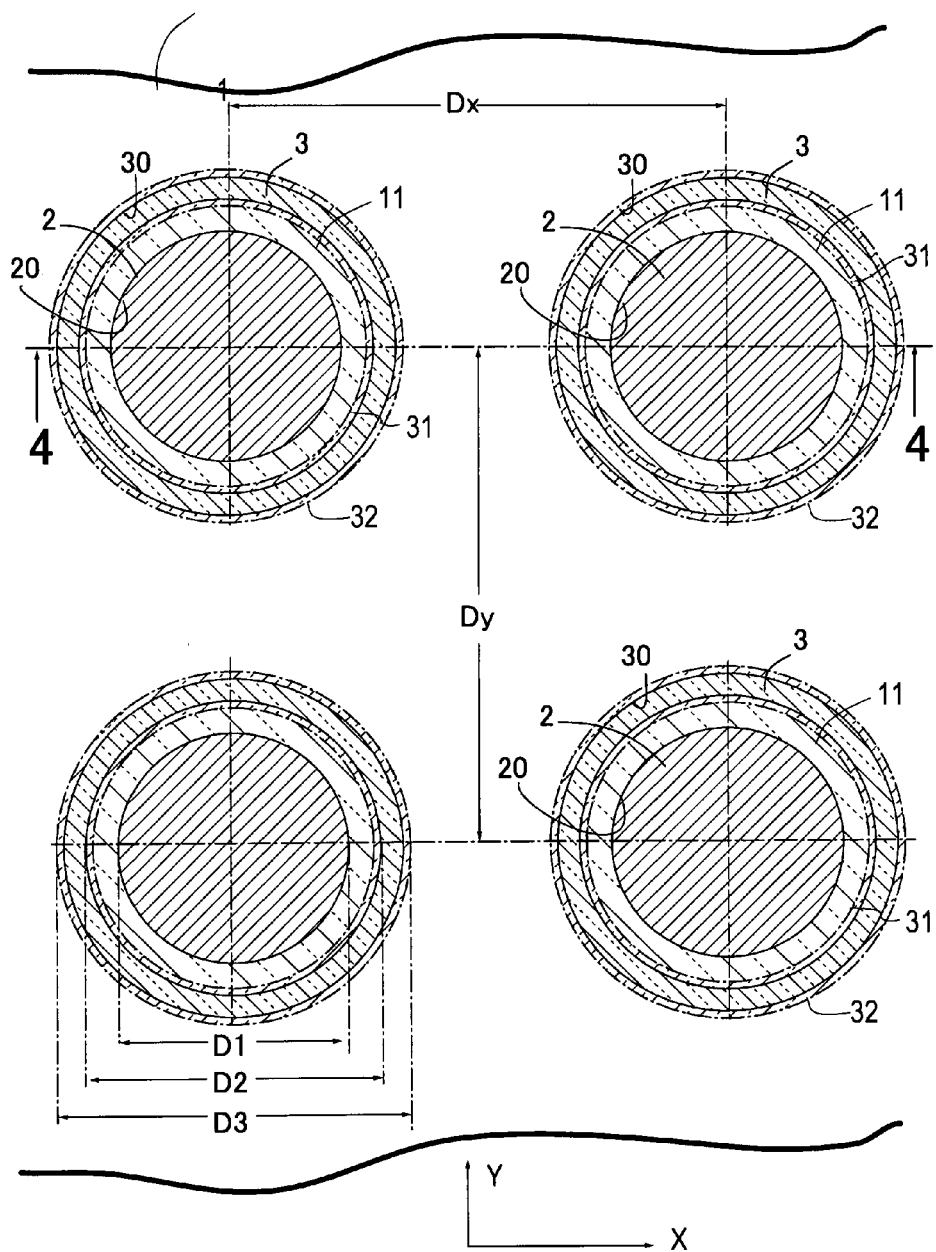
FIG. 3 is a plan view showing a part of a semiconductor substrate according to the present invention.
Figure 4:
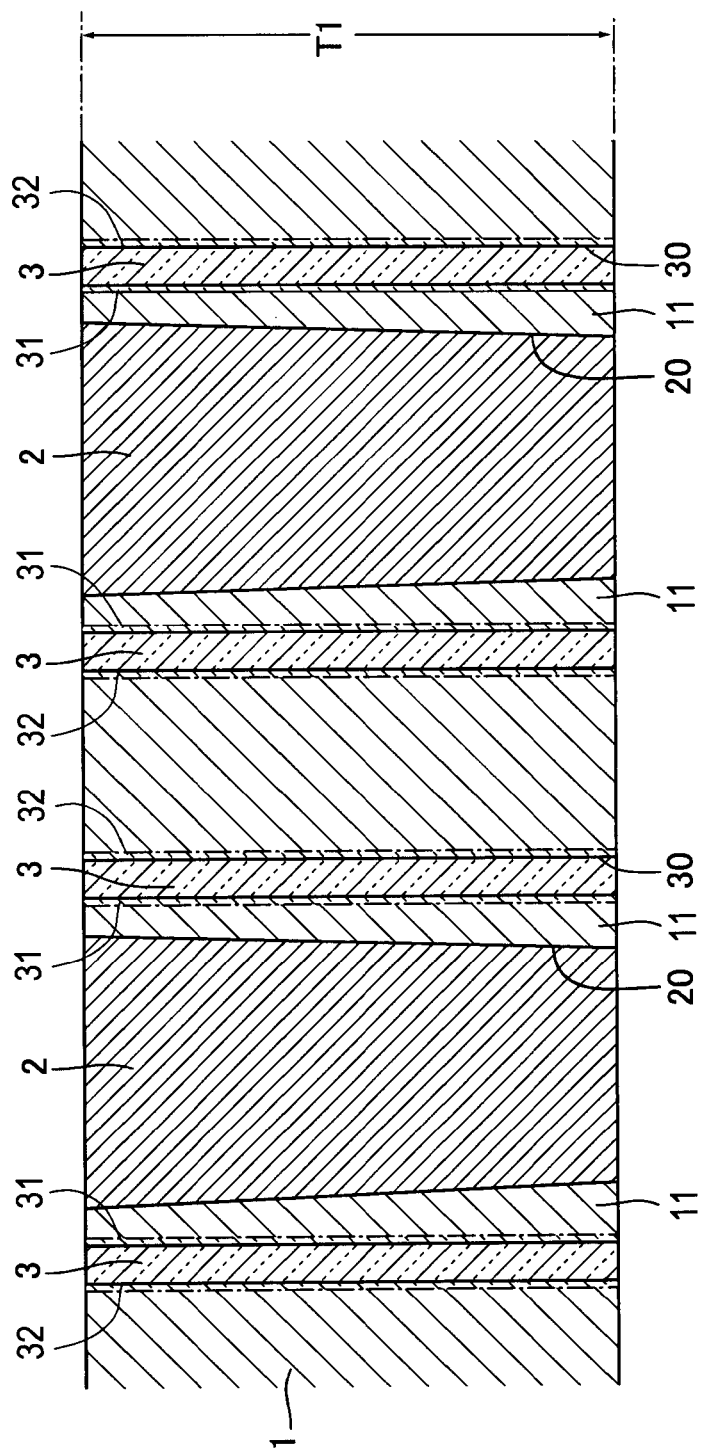
FIG. 4 is a sectional view taken along the line 4-4 in FIG. 3.
Figure 5:
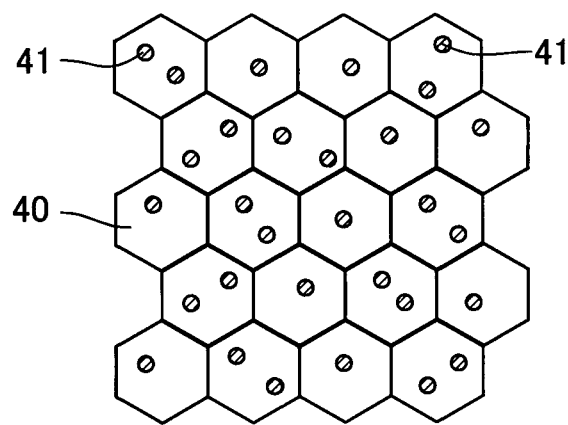
FIG. 5 is a drawing schematically showing a composite material including a metal/alloy component of a nanocomposite crystal structure according to the present invention.
Figure 6:
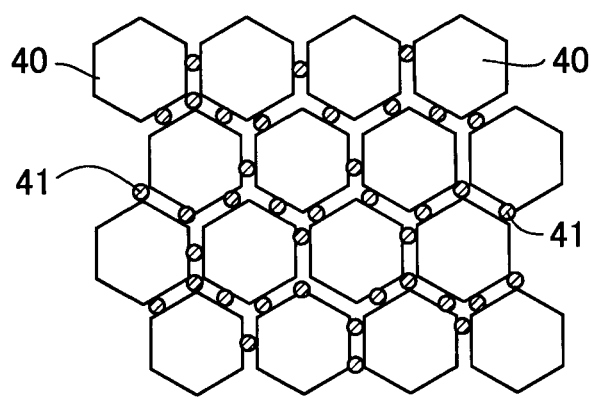
FIG. 6 is a drawing schematically showing a composite material including a metal/alloy component of a nanocomposite crystal structure according to the present invention.
Figure 7:
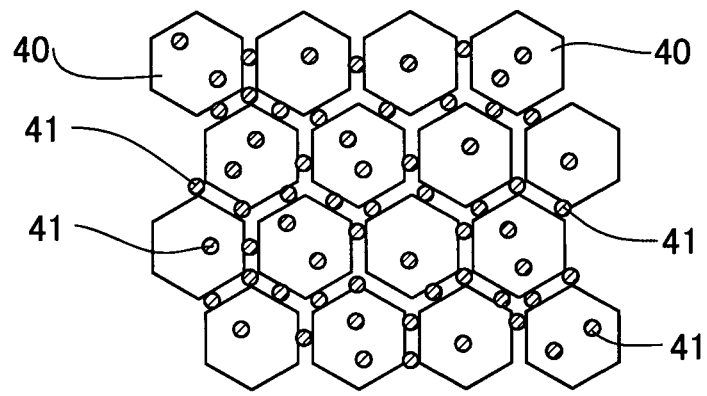
FIG. 7 is a drawing schematically showing a composite material including a metal/alloy component of a nanocomposite crystal structure according to the present invention.

Referring next to FIGS. 3 and 4, an interposer having vertical conductors 2 along with the insulating layers 3 is shown as an example of the semiconductor substrate 1 according to the present invention. In these figures, the portions corresponding to the components shown in FIGS. 1 and 2 are denoted by the same reference symbols and duplicate explanations are omitted. The interposer shown in FIGS. 3 and 4 includes the semiconductor substrate 1, the vertical conductors 2 and the insulating layers 3. The semiconductor substrate 1 is, for example, a silicon substrate having a thickness T1 and in the form of a wafer or a chip cut out from the wafer. The thickness T1 may be, but not limited to, about 50 to 700 µm.

The insulating layer 3 is ring-shaped and provided in a ring-shaped groove 30 that is formed in the semiconductor substrate 1 to surround the vertical conductor 2. With the insulating layer 3, accordingly, the semiconductor substrate 1 is divided into an inner ring-shaped portion 11 and an outer portion. Thus, the vertical conductor 2 is electrically insulated from the semiconductor substrate 1 and the other vertical conductors 2.

The ring-shaped groove 30 can be formed by a known technology such as a CVD process or a laser drilling process. The ring-shaped groove 30 is formed in the semiconductor substrate 1 along its thickness direction to have a first diameter D2 that is larger than a diameter D1 of a vertical hole 20 having the vertical conductor 2. Between the wall surface of the vertical hole 20 and the inner wall surface of the ring-shaped groove 30 having the first diameter D2, accordingly, the semiconductor substrate 1 is left like an island by a diameter difference (D2−D1), providing the ring-shaped portion 11. The ring-shaped groove 30 has a second diameter D3 away from the first diameter D2 by a groove width. That is, the ring-shaped groove 30 has a groove width (D3−D2). The groove width of the ring-shaped groove 30 may be, but not limited to, equal to or less than 10 µm, for example, a few µm.

The insulating layer 3 is the same as described with reference to FIGS. 1 and 2, but the insulating region may further include insulating layers 31, 32. The insulating layers 31, 32 preferably include an oxide layer, more preferably a nitride layer. The oxide layer and the nitride layer may be a single layer, multiple layers or a combination thereof. In addition, the oxide layer and the nitride layer may be a layer deposited on inner surfaces of the ring-shaped groove or a layer obtained by oxidizing or nitriding the surface of the semiconductor substrate 1 which appears on the inner surfaces of the ring-shaped groove 30. With this insulating structure, a negative effect of the insulating layer 3 on the semiconductor substrate 1 can be blocked by the insulating layers 31, 32.

The insulating layers 31, 32 shown in the present embodiment are obtained by oxidizing or nitriding the wall surfaces of the ring-shaped groove 30. That is, the wall surfaces of the ring-shaped groove 30 are covered with the insulating layers 31, 32, and the insulating layer 3 is filled in the ring-shaped groove 30 covered with the insulating layers 31, 32.

If the semiconductor substrate 1 is a common silicon substrate, for example, the oxide layer is a silicon oxide layer and the nitride layer is a silicon nitride layer. The silicon oxide layer and the silicon nitride layer may be formed by applying a known technology. For example, there have been known a process of oxidizing or nitriding a surface of a silicon substrate and a process of depositing an insulating layer using a chemical vapor deposition process (CVD process), and either process may be employed. The oxidizing or nitriding depth of the insulating layers 31, 32, i.e., substantial layer thickness is preferably determined in view of actually required transmission characteristics.

The insulating layer 3 may be a single layer or may have a coaxially, spacedly arranged multilayer structure. In addition, its shape is not limited to the illustrated circular shape but may be a polygonal shape such as a rectangular shape. Moreover, the vertical conductor 2 is not limited to the illustrated circular or cylindrical shape, either. It may have a prismatic shape.

The vertical conductor 2 is filled in the vertical hole 20 extending along the thickness direction of the semiconductor substrate 1. The vertical conductors 2 are distributed in rows in a substrate surface. Such vertical conductors 2 can be formed by applying a molten metal filling process, a conductive paste filling process, a metal/alloy disperse system filling process or the like. The vertical conductor 2 shown in the present embodiment is a through-electrode passing through the semiconductor substrate 1.

As shown in FIG. 3, the vertical conductors 2 are arranged at a given arrangement pitch Dx, Dy in X, Y directions as seen in an X-Y plane taken along the substrate surface. For example, the dimensions regarding the vertical conductors 2 are such that the arrangement pitch Dx, Dy is in the range of 4 to 100 µm and the maximum diameter D1 is in the range of 0.5 to 25 µm. However, the arrangement pitch Dx, Dy is not required to be a certain size, while the diameter D1 is not limited to the above value, either.

The vertical conductor 2 has a nanocomposite crystal structure. In the vertical conductor 2 having a nanocomposite crystal structure, since the growth of columnar crystal is restrained and the formation of equiaxed crystal is facilitated by the effect of the nanocomposite crystal structure, stress can be reduced.

FIGS. 5 to 8 schematically illustrate a general understanding of the nanocomposite crystal structure. In the embodiment shown in FIG. 5, second nanosized crystal structures 41 are dispersed in first crystal structures 40. Alternatively, the second nanosized crystal structures 41 may be dispersed in grain boundaries between the first crystal structures 40

Figure 8:
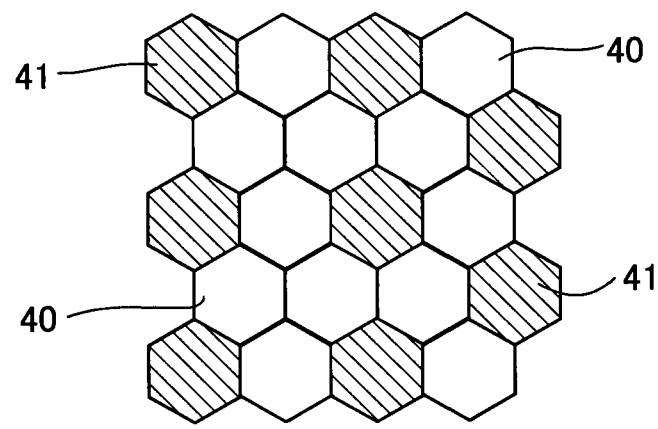
FIG. 8 is a drawing schematically showing a composite material including a metal/alloy component of a nanocomposite crystal structure according to the present invention.

(see FIG. 6), or contrary to this, first nanosized crystal structures 40 may be dispersed in grain boundaries between second crystal structures 41, or the second nanosized crystal structures 41 may be dispersed not only in the first crystal structures 40 but also in the grain boundaries between the first crystal structures 40 (see FIG. 7), or both the first crystal structures 40 and the second crystal structures 41 may be nanosized (see FIG. 8). Although not illustrated, the embodiments of FIGS. 5 to 8 may be combined with each other. Moreover, it is also possible to form another type of nanocomposite crystal structure different from the above-described nanocomposite crystal structure composed of the first crystal structures 40 and the second crystal structures 41.

The first crystal structures 40 and the second crystal structures 41 may have a common metal component. Alternatively, their metal components may be completely different from each other. The distinction between the first crystal structures 40 and the second crystal structures 41 comes from the difference in melting point between contained metal elements or the presence or absence of eutectic reaction or alloying. Moreover, the nanocomposite crystal structure can be obtained by using a melt filling process for metal/alloy nanoparticles or a plating process in combination with sputtering.

Typically, the first crystal structures 40 and the second crystal structures 41 are a combination of non-eutectic structures and eutectic structures. "Eutectic" refers to a crystal structure of an alloy or the like, wherein when two kinds of metals A and B are melted to form an alloy, for example, if the ratio between the metals A and B is not within the solid solubility limit (the limit for formation of a solid solution) of the metal B to the metal A or within the solid solubility limit of the metal A to the metal B, the resulting alloy becomes a mixture of solid solution crystals having different component ratios, thereby forming eutectic structures. If the metals A and B do not satisfy the above requirements or the melting temperature does not reach the eutectic point, the metals A and B which would otherwise become eutectic form non-eutectic structures. The non-eutectic structures may also be obtained by adding a third metallic element that is different from the metallic elements for the eutectic reaction.

If the first crystal structures 40 are non-eutectic structures, the second crystal structures 41 are eutectic structures. As can be seen from FIGS. 5 to 8, nanocomposite crystal structures based on this combination may be as follows:
(a) Nanoparticles that are eutectic structures are dispersed in non-eutectic structures;
(b) Nanoparticles that are eutectic structures are dispersed in grain boundaries between non-eutectic structures;
(c) Nanoparticles that are non-eutectic structures are dispersed in grain boundaries between eutectic structures;
(d) Nanoparticles that are eutectic structures are dispersed not only in non-eutectic structures but also in grain boundaries between non-eutectic structures; and
(e) Both eutectic structures and non-eutectic structures are nanosized.

Important factors determining material properties of the vertical conductor 2 are columnar crystal and equiaxed crystal. The columnar crystal inherently grows into a large grain. Accordingly, it can easily serve as a propagation path of cracking, causing breakage or cracking of the insulating layer formed around it. In the case of the equiaxed crystal, on the other hand, since the grain growth is isotropic and the grain size itself is small, a stress occurring in the substrate can be reduced.

When the vertical conductor 2 undergoes a heating process in the manufacturing process, moreover, since metals commonly have positive volume changes, the vertical conductor 2 generally expands and then contracts. With this thermal expansion and contraction, a stress occurs in the substrate. The equiaxed crystal also has the effect of suppressing the occurrence of stress due to the metal expansion.

In the present invention, as described above, since the vertical conductor 2 has a nanocomposite crystal structure, the formation of equiaxed crystal is facilitated while suppressing the formation of columnar crystal. This relaxes the stress to be applied to the semiconductor substrate 1 or suppresses characteristic degradation.

In addition, the nanocomposite crystal structure has the effect of facilitating the formation of equiaxed crystal in the vertical conductor 2. Because of the above specific characteristics of the nanocomposite crystal structure, characteristic degradation of a semiconductor circuit can be suppressed, particularly, in the semiconductor substrate 1.

Moreover, fracturing or cracking of the insulating layer 3 can also be suppressed. Since the insulating layer 3 is formed around the vertical conductor 2 in a ring shape, the stress occurring in the vertical conductor 2 can be applied to the insulating layer 3. If the stress is too large, the insulating layer 3 may be fractured or cracked. If the insulating layer 3 is fractured or cracked, the insulating layer 3 cannot play a primary role, causing leakage of current from the vertical conductor 2 to the semiconductor substrate 1. In the present invention, since the vertical conductor 2 includes a metal/alloy component of a nanocomposite crystal structure, the stress can be reduced. In addition, since the nanocomposite crystal structure serves to facilitate the formation of equiaxed crystal, the stress reducing effect becomes more effective. Therefore, the stress to be applied from the vertical conductor 2 to the semiconductor substrate 1 forming the inner wall surface of the vertical hole and to the insulating layer 3 located outside it can be relaxed to avoid fracturing or cracking of the inner wall surface of the vertical hole and the insulating layer 3.

Figure 9:
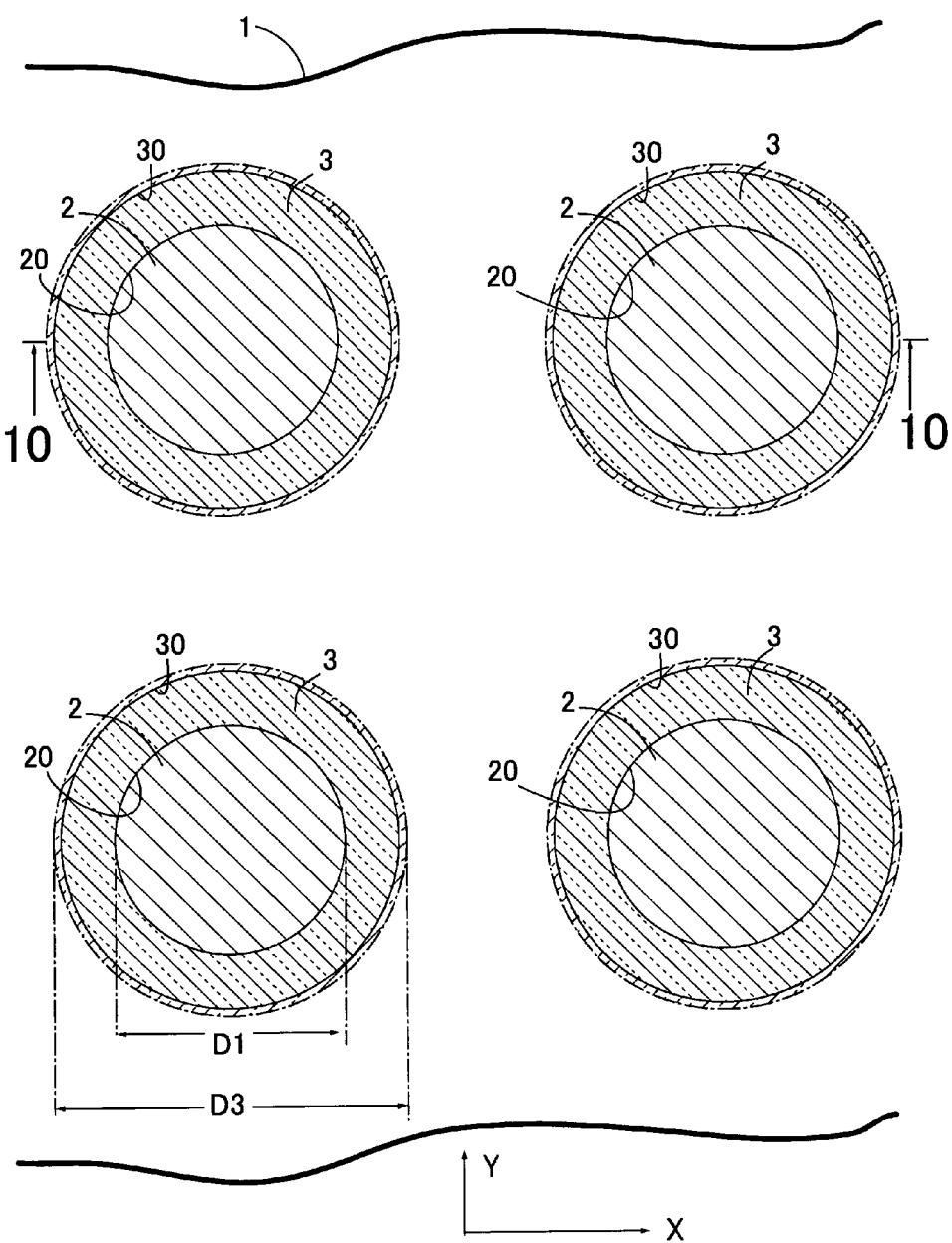
FIG. 9 is a plan view showing another embodiment of a semiconductor substrate according to the present invention.
Figure 10:
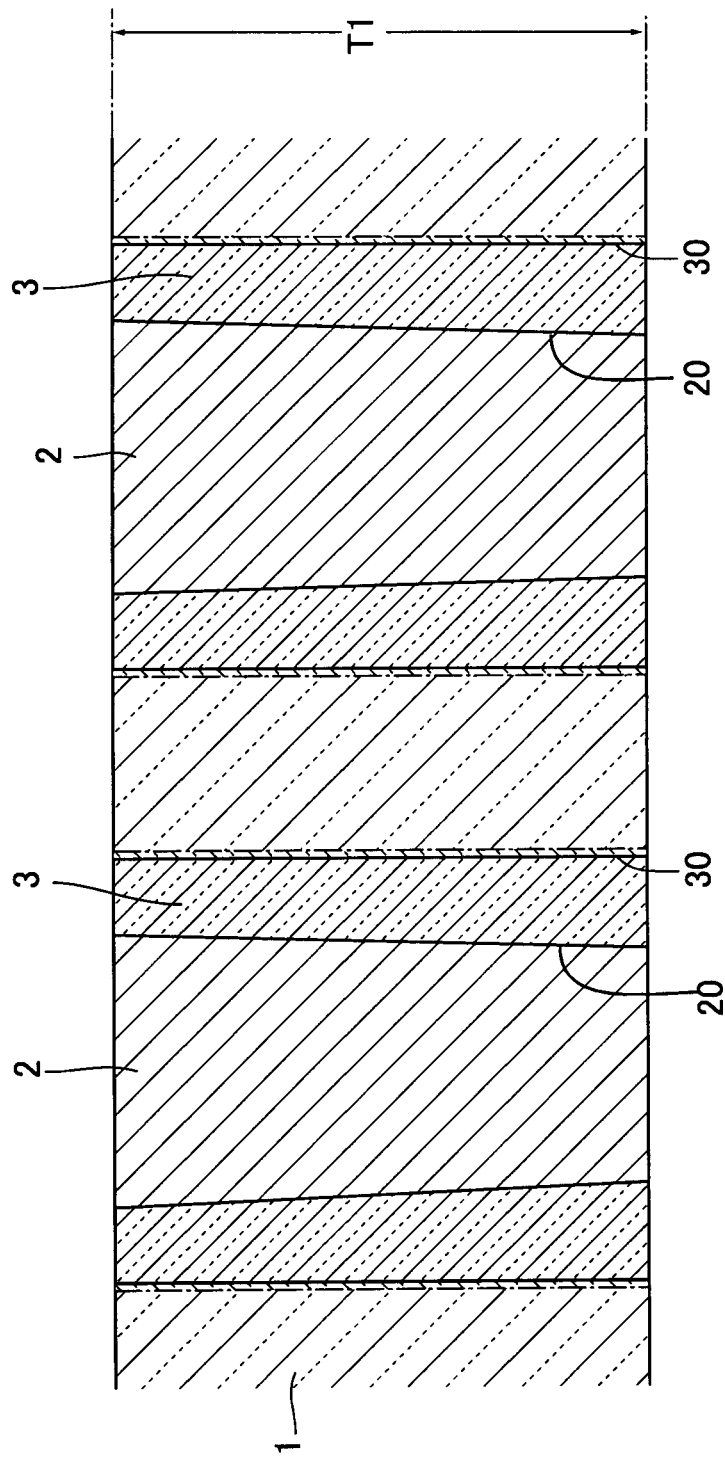
FIG. 10 is a sectional view taken along the line 10-10 in FIG. 9.

FIGS. 9 and 10 illustrate still another embodiment. In this embodiment, the insulating layer 3 is filled in a first hole 30 that is formed in the semiconductor substrate 1 along its thickness direction, and the vertical conductor 2 is filled in a second hole 20 that is formed in the insulating layer 3. Also in this embodiment, as shown in FIG. 3 under magnification, the insulating layer 3 includes the silica particles 311 and the silica 320 filling up the surrounding area of the silica particles 311, so that the vertical conductor 2 is electrically insulated from the semiconductor substrate 1 and the other vertical conductors 2.

Also in the interposers shown in FIGS. 3 to 10, since the insulating layer 3 includes the silica particles 311 and the silica 320 filling up the surrounding area of the silica particles 311, the effects described with reference to FIGS. 1 and 2 can be obtained.

Since the nanocomposite structure formed from a combination of the nm-sized silica particles 311 and the nanocrystal or nanoamorphous silica 320 filling up the surrounding area of the silica particles 311 serves to relax the stress occurring in the vicinity of a through-electrode, the distance between the vertical conductor 2 forming the through-electrode and semiconductor circuit elements can be shortened to improve area efficiency for formation of the semiconductor circuit elements.

In addition, since the insulating layer 3 insulates the vertical conductor 2 extending along the thickness direction of the semiconductor substrate 1 from the semiconductor substrate 1, the semiconductor substrate 1 and the vertical conductor 2, e.g., the through-electrode can be electrically insulated with the insulating layer 3 from the other vertical conductors 2 and the semiconductor circuit elements formed in the semiconductor substrate 1.

Moreover, the insulating layer 3 can be formed by filling an insulating material into a ring-shaped groove or a hole that is formed in the semiconductor substrate 1 along its thickness direction. The insulating layer 3 thus formed does not cost much and has a sufficiently large thickness commensurate with the width of the ring-shaped groove or the diameter of the hole 30. Therefore, the capacitance between the vertical conductor 2 and the semiconductor substrate 1 can be reduced to provide an insulating structure capable of contributing to improvement in signal transmission properties and reduction of power consumption.

Furthermore, since the insulating layer 3 has a sufficient thickness commensurate with the width of the ring-shaped groove or the diameter of the hole 30, the stress occurring in the vicinity of the vertical conductor 2 can be relaxed to improve area efficiency for formation of semiconductor circuit elements.

Figure 11:
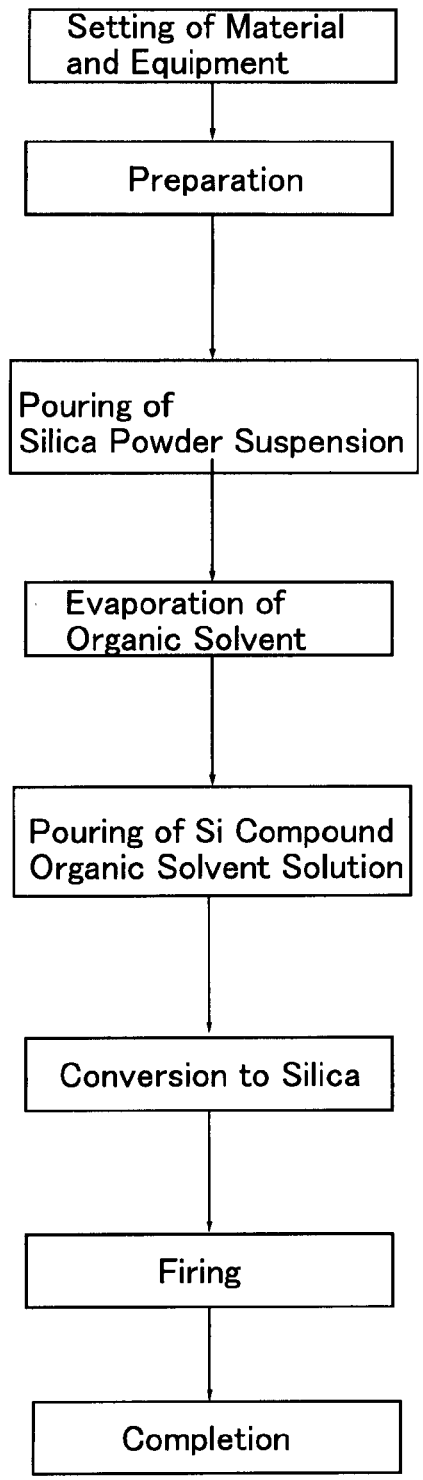
FIG. 11 is a drawing showing an entire manufacturing process of a semiconductor substrate according to the present invention.
Figure 11:
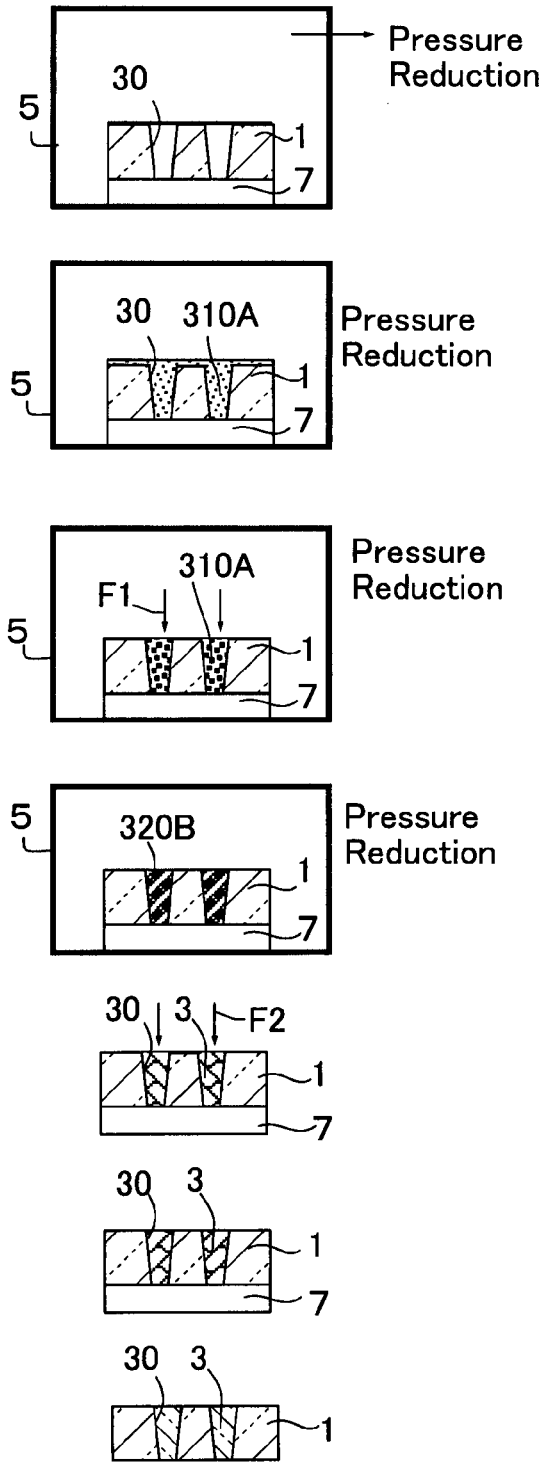

A method for manufacturing the semiconductor substrate 1 shown in FIGS. 1 to 6 will be described below with reference to FIGS. 11 to 20. FIG. 11 is a drawing an entire manufacturing process. FIGS. 12 to 16 are drawings each showing a part of the process depicted in FIG. 11. Even without any particular reference, the following description will be made based on FIG. 11.

Figure 12:
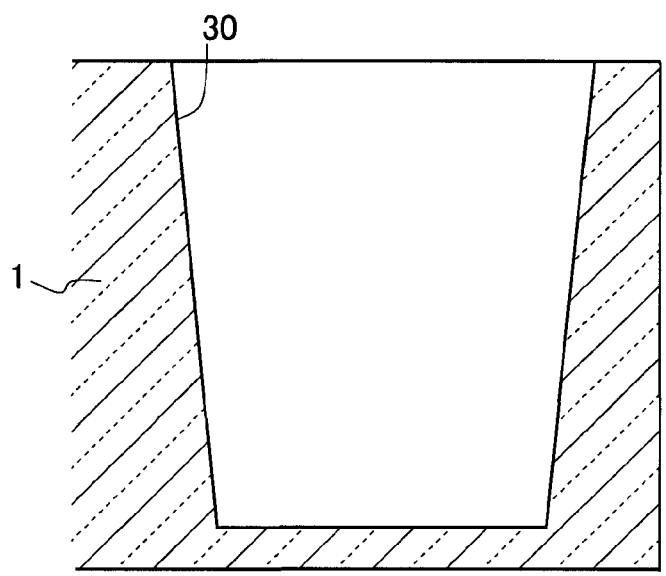
FIG. 12 is a drawing showing a part of the manufacturing process shown in FIG. 11.

At first, as shown in FIGS. 11 and 12, a via 30 is formed in a semiconductor substrate 1 along its thickness direction. Such a via 30 can be formed by a known technology such as a CVD process or a laser drilling process. The via 30 may be formed either after formation of a semiconductor circuit in the semiconductor substrate 1 (via-first) or before formation of the semiconductor circuit (via-last). Preferred is the via-last in view of the entire process of processing the semiconductor substrate. It should be noted that the via 30 may be a through-hole or a blind hole. As measured at its open end, the via 30 has a minimum width (hole diameter) equal to or less than 10 µm, for example, about a few µm.

Figure 13:
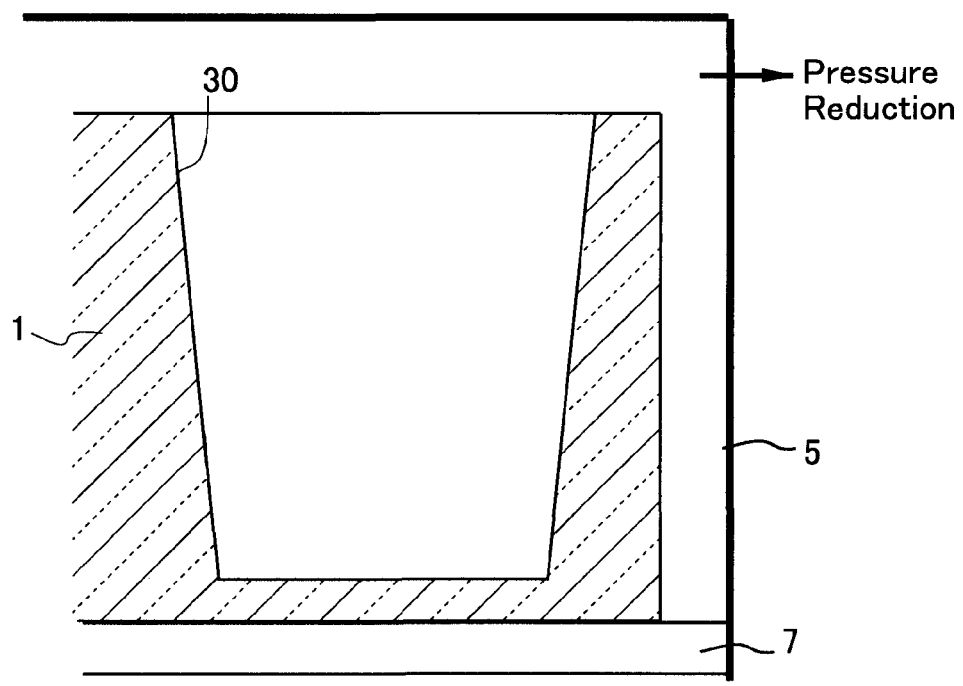
FIG. 13 is a drawing showing a step after the step shown in FIG. 12.

Then, as shown in FIGS. 11 and 13, the semiconductor substrate 1 having the via 30 formed therein is set within a vacuum chamber 5. The semiconductor substrate 1 can be set on a suitable support 7 with the open end of the via 30 directed upward. After the setting, the vacuum chamber 5 is evacuated for pressure reduction to have an internal pressure lower than the atmospheric pressure.

Figure 14:
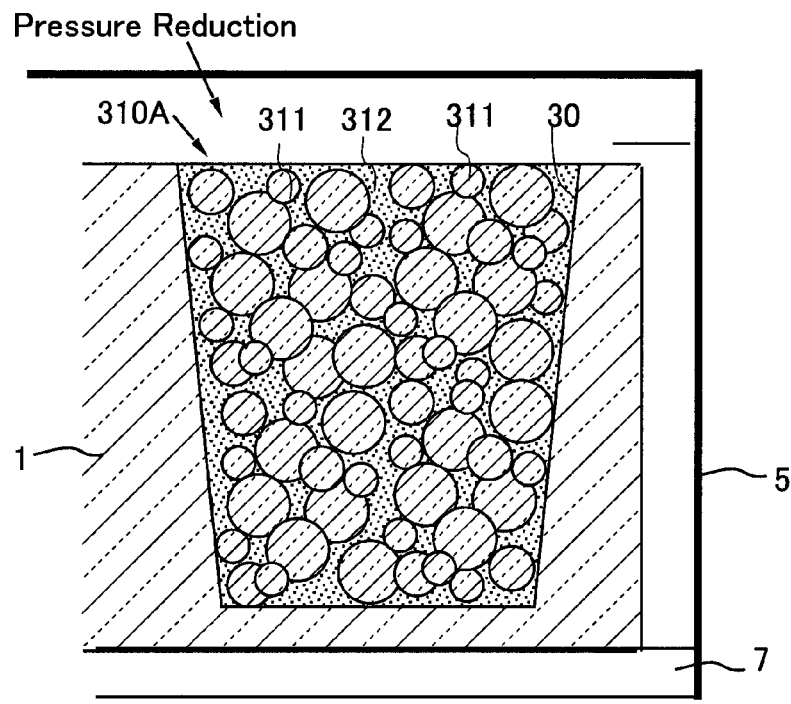
FIG. 14 is a drawing showing a step after the step shown in FIG. 13.

Then, as shown in FIGS. 11 and 14, a suspension 310A having a silica powder 311 dispersed in a volatile organic solvent 312 is poured into the via 30 within the vacuum chamber 5 after the pressure reduction. The volatile organic solvent 312 should be the one capable of contributing to conversion to silica during the step of conversion to silica that will be described later. Typically, it may be alcohols having a hydroxyl group (OH). The silica powder 311 comprises nm-sized silica particles. Preferably, after a portion of the poured suspension 310A overflowing from the via 30 is wiped off, the pressure reduction is performed in that condition.

Since most of the volatile organic solvent 312 in the suspension 310A poured into the via 30 can evaporate under a reduced-pressure atmosphere within the vacuum chamber 5, spaces G1 can be created between the silica particles 311. However, as shown in FIG. 11, OH groups 313 in the organic solvent adhere to the surface of the silica particles 311 because of their bonding force to $SiO_2$. It is also possible to apply a pressure F1 to a mass of the silica particles 311 after the evaporation of the volatile organic solvent 312.

Figure 16:
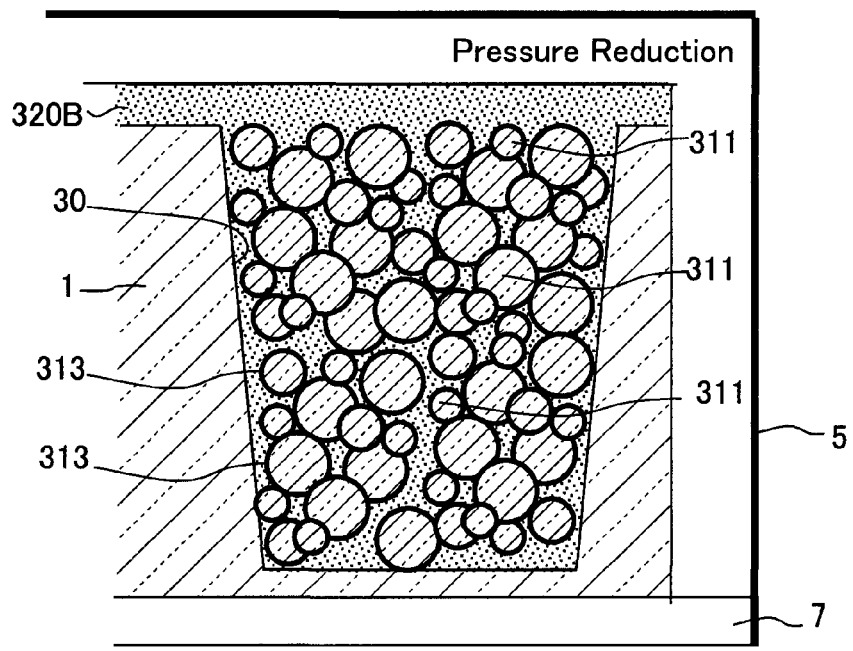
FIG. 16 is a drawing showing a step after the step shown in FIG. 15.

Then, as shown in FIGS. 11 and 16, a liquid silica or liquid Si compound 320B is poured into the via 30. The liquid silica or liquid Si compound 320B infiltrates into the spaces G1 around the silica particles 311. Also in this case, the work is still done under a reduced-pressure atmosphere within the vacuum chamber 5. It is also possible to adopt a differential pressure filling process, wherein the internal pressure of the vacuum chamber 5 is increased after the pressure reduction. With this differential pressure filling, the liquid silica or liquid Si compound 320B can be sufficiently infiltrated into the spaces around the silica particles.

When using the liquid silica, the conversion to silica occurs with the evaporation of the organic solvent. When using the liquid Si compound, the Si compound is reacted with the OH groups 313 adhering to the surface of the silica particles 311 to cause the conversion to the silica 320.

As has been described hereinabove, examples of the liquid Si compound 320B include a silazane, a siloxane and a silanol. The following description will be made taking as an example the case where a polysilazane (PHPS) that is an inorganic silazane polymer is used. The polysilazane can be converted to the silica 320 through reaction with water or oxygen. The organic solvent may be a xylene, a mineral turpentine or an high-boiling aromatic solvent.

Figure 15:
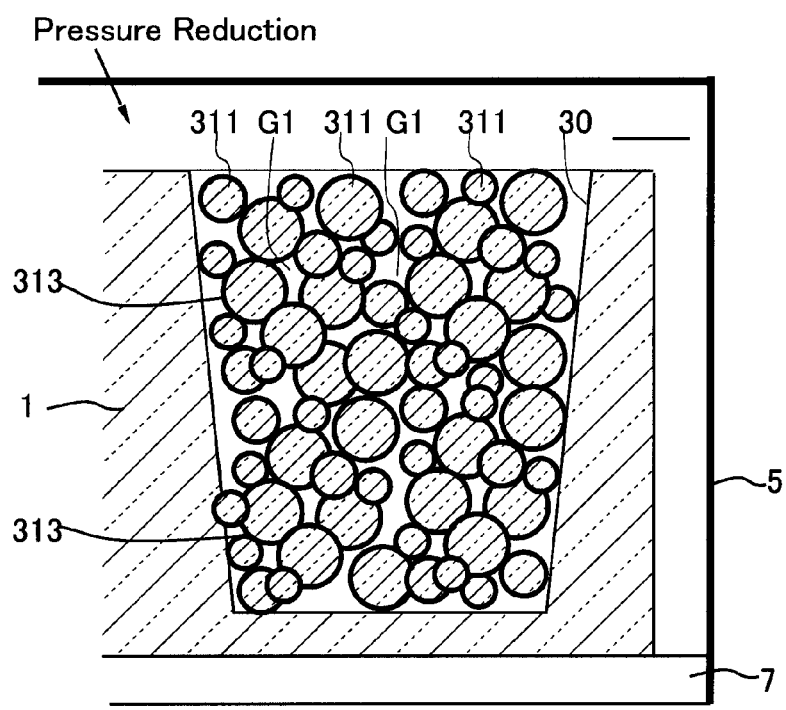
FIG. 15 is a drawing showing a step after the step shown in FIG. 14.

In the present invention, the OH groups 313 are left on the surface of the silica particles 311, as shown in FIG. 15, and the polysilazane is converted to the silica 320 through reaction with the OH groups 313, as shown in FIG. 16. Usually, the silica 320 thus obtained becomes amorphous.

Figure 17:
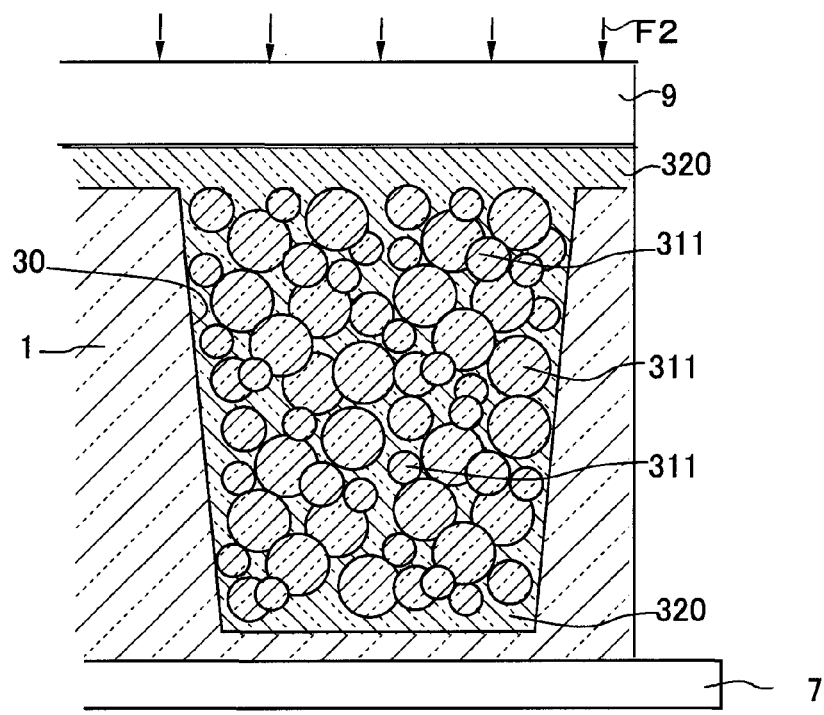
FIG. 17 is a drawing showing a step after the step shown in FIG. 16.
Figure 18:
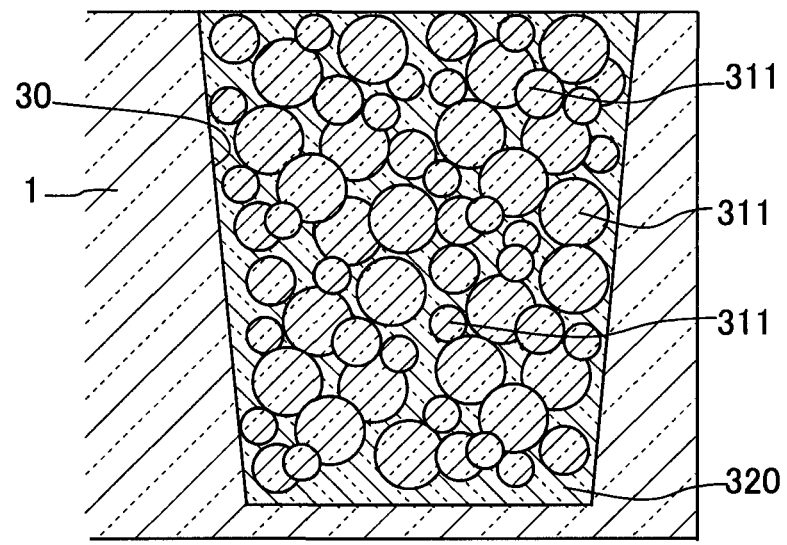
FIG. 18 is a drawing showing a step after the step shown in FIG. 17.

In order to promote the conversion to the silica 320, preferably, heating is performed under a pressure with a pressing plate 9 or the like, as shown in FIG. 17. The heating temperature varies with the kind of polysilazane but can usually be set within the range from a room temperature to 450° C. During this heating treatment, a cracked gas from the organic solvent can be released.

After the above step, firing is preferably performed, for example, at around 1000° C. so as to further promote the conversion to the silica and release the cracked gas. The semiconductor substrate 1 shown in FIGS. 1 and 2 and further shown in FIG. 18 can be thus obtained.

Figure 19:
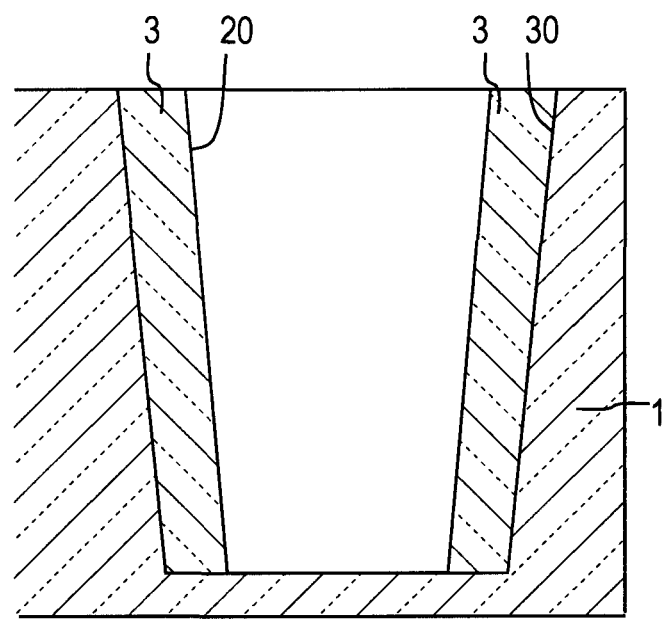
FIG. 19 is a drawing showing a step after the step shown in FIG. 18.
Figure 20:
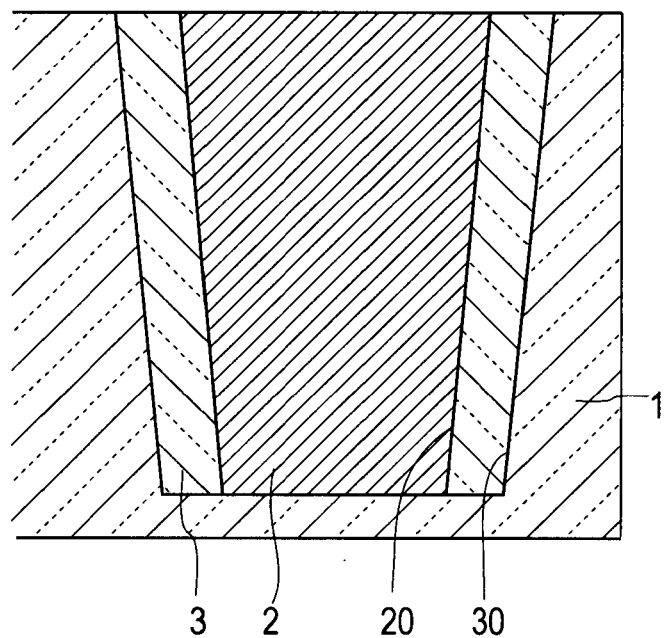
FIG. 20 is a drawing showing a step after the step shown in FIG. 19.

Then, the vertical conductor 2 should be formed so as to obtain the semiconductor substrate 1 shown in FIGS. 3 and 4. In the case where the insulating layer 3 is ring-shaped as shown in FIGS. 3 and 4, a specific temporal relationship regarding which should be formed first does not occur between the process of forming the insulating layer 3 and the process of forming the vertical conductor 2, but in the case of the structure shown in FIGS. 9 and 10, what is required first is to undergo the process shown in FIGS. 11 to 18. Then, after the second hole 20 is formed in the insulating layer 3 as shown in FIG. 19, the vertical conductor 2 is formed as shown in FIG. 20.

The vertical conductor 2 may be formed by a plating deposition process but is preferably formed either by a molten metal filling process in which a molten metal is poured with the second hole 20 used as a mold or by a metal/alloy disperse system filling process in which poured is a disperse system having a metal-alloy powder dispersed in a disperse medium. This is because significant cost reduction can be achieved in both cases. When using the molten metal filling process or the metal/alloy disperse system filling process, it is possible to adopt a differential pressure filling process, wherein the semiconductor substrate 1 is placed in the vacuum chamber 5, the pressure is reduced by evacuation, a filling material is poured into the second hole 20, and then the internal pressure of the vacuum chamber 5 is increased.

Then, the filling material within the second hole 20 is pressurized using a pressing plate or the like and hardened by cooling under a pressure. This restrains the growth of columnar crystal to provide the vertical conductor 2 with a nanocomposite crystal structure. Since the growth of columnar crystal is restrained and the formation of equiaxed crystal is facilitated by the effect of the above nanocomposite crystal structure, stress can be reduced.

Figure 21:
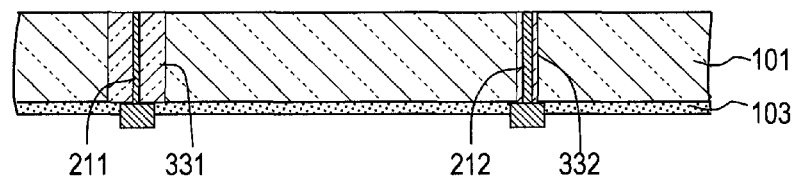
FIG. 21 is a sectional view showing another embodiment of a semiconductor substrate according to the present invention.

The thickness and cross sectional diameter of the vertical conductor 2 and the insulating layer 3 vary with a current capacity required for the vertical conductor 2. One example is shown in FIG. 21. FIG. 21 shows an example of an interposer, wherein a protective film 103 is adhered to the surface of a semiconductor substrate 101.

The semiconductor substrate 101 has two kinds of vertical conductors 211, 212, wherein when the vertical conductor 211 is a signal path and the vertical conductor 212 is a power-supply path, for example, the vertical conductor 212 which becomes a power-supply path may have a larger cross sectional diameter than the vertical conductor 211 which becomes a signal path.

Regarding the insulating structure, on the other hand, an insulating layer 331 for the vertical conductor 211 which becomes a signal path may have a large thickness so as to reduce capacitance and stray capacitance and improve high-frequency characteristics, while an insulating layer 332 for the vertical conductor 212 which does not take part in signal transmission may have a small thickness which barely provides required electrical insulation.

Figure 22:
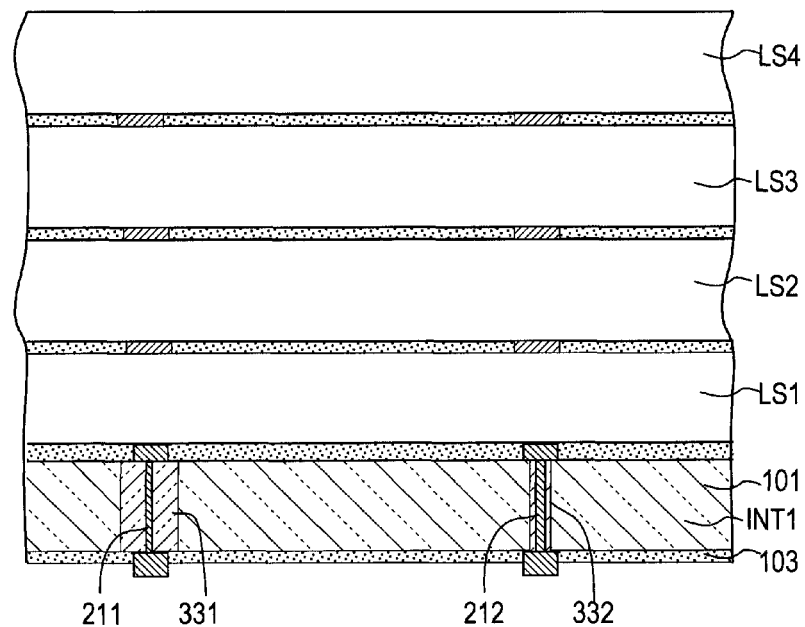
FIG. 22 is a sectional view showing an example of an electronic device using a semiconductor substrate according to the present invention.

In addition to the interposer, the semiconductor substrate 1 according to the present invention may take the form of a substrate having semiconductor elements within the semiconductor substrate 1. One example is shown in FIG. 22. In this figure, the portions corresponding to the components shown in FIG. 21 are denoted by the same reference symbols and duplicate explanations are omitted.

Referring to FIG. 22, illustrated is an electronic device in which substrates LS1 to LS4 that are semiconductor wafers or semiconductor devices are stacked in order on the interposer INT shown in FIG. 21 and bonded to each other. Typically, such an electronic device can take the form of a three-dimensional system-in-package (3D-SiP). Specifically, it may be a system LSI, a memory LSI, an image sensor, a MEMS or the like. It may also be an electronic device including an analog or digital circuit, a memory circuit such as DRAM, a logic circuit such as CPU or the like or an electronic device that is obtained by preparing different types of circuits such as an analog high frequency circuit and a low frequency, low power consumption circuit in different processes and stacking them.

More specifically, it includes most of electronic devices having an electronic circuit as a functional element, such as a sensor module, an optoelectronic module, a unipolar transistor, a MOS FET, a CMOS FET, a memory cell, integrated circuits (IC) thereof, or various scales of LSIs. In the present invention, integrated circuits called "LSI" include all types of integrated circuits such as a small-scale integration, a medium-scale integration, a large-scale integration, a very-large-scale integration (VLSI), an ultra-large-scale integration (ULSI), and so on.

Even if the foregoing various types of electronic devices are different from the one disclosed in this specification regarding the stacking structure of substrates, the type of the semiconductor substrate 1, the shape, arrangement and hole diameter of the vertical conductors 2 passing through the semiconductor substrate 1 or the like, they can be included in the present invention as long as satisfying the present invention regarding the structure of the insulating layer 3 and the relationship of the insulating layer 3 to the vertical conductor 2.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A semiconductor substrate comprising a vertical conductor and an insulating layer, the vertical conductor including a metal/alloy component of a nanocomposite crystal structure and being filled in a vertical hole formed in the semiconductor substrate along its thickness direction, the insulating layer being formed around the vertical conductor in a ring shape and including nm-sized silica particles and a nanocrystal or nanoamorphous silica filling up a space between the silica particles to provide a nanocomposite structure along with the silica particles.

2. The semiconductor substrate of claim 1, wherein the insulating layer is obtained with a liquid silica or liquid Si compound infiltrated into the space between the silica particles to have a nanocrystal region and a nanoamorphous region.

3. The semiconductor substrate of claim 1, wherein the insulating layer is filled in a hole or groove formed in the semiconductor substrate along its thickness direction.

4. The substrate of claim 3, wherein the silica particles have a particle size equal to or less than one-tenth of a hole diameter of the hole or a width of the groove.

5. The substrate of claim 1, which is an interposer.

6. An electronic device comprising substrates claimed in claim 1.

7. The electronic device of claim 6, which is a three-dimensional system-in-package (3D-SiP).

8. The electronic device of claim 6, which is one of a system LSI, a memory LSI, an image sensor and a MEMS.

* * * * *